United States Patent [19]

Kuo et al.

[11] Patent Number: 5,034,923

[45] Date of Patent: Jul. 23, 1991

[54] STATIC RAM WITH SOFT DEFECT DETECTION

[75] Inventors: Clinton C. K. Kuo; Ernest A. Carter, both of Austin, Tex.

[73] Assignee: Motorola, Inc., Schaumburg, Ill.

[21] Appl. No.: 283,032

[22] Filed: Dec. 5, 1988

Related U.S. Application Data

[63] Continuation-in-part of Ser. No. 95,810, Sep. 10, 1987, abandoned.

[51] Int. Cl.$^5$ .................... G11C 11/407; G11C 29/00
[52] U.S. Cl. ................. 365/189.01; 365/154; 365/200; 365/201
[58] Field of Search ............ 365/189.01, 154, 200, 365/201; 371/21, 21.2

[56] References Cited

U.S. PATENT DOCUMENTS

| | | | |
|---|---|---|---|
| 3,812,388 | 5/1974 | Southworth | 307/291 |
| 4,004,222 | 1/1977 | Gebhard | 324/158 |
| 4,554,664 | 11/1985 | Schultz | 371/25 |
| 4,670,878 | 6/1987 | CHilders | 365/201 |
| 4,680,762 | 7/1987 | Hardee et al. | 371/28 |
| 4,685,086 | 8/1987 | Tran | 365/203 |
| 4,739,198 | 4/1988 | Maruyama | 365/208 |
| 4,758,990 | 7/1988 | Uchida | 365/203 |
| 4,780,851 | 10/1988 | Kurakami | 365/200 |
| 4,893,278 | 1/1990 | Ito | 365/203 |

Primary Examiner—James W. Moffitt
Attorney, Agent, or Firm—Jonathan P. Meyer

[57] ABSTRACT

A static RAM includes test features which provide for the detection of soft defects which may cause a defective SRAM cell to behave as a functional DRAM cell. Provision is made for writing either a high or a low logic state to each bit line of the SRAM while not writing any value to its complementary bit line and for sensing the state of each bit line independently of the state of its complementary bit line. In addition, a current test is provided which detects soft defects by means of the increased inverter leakage current caused thereby. It is possible, by properly combining these tests, to reliably detect all soft defects, thereby assuring the data retention capability of the SRAM. This technique avoids the long hold time and/or high temperature test techniques used in the prior art.

15 Claims, 10 Drawing Sheets

STATIC RAM WITH SOFT DEFECT DETECTION

This application if a continuation-in-part of prior application Ser. No. 095,810, filed Sept. 10, 1987, now abandoned.

FIELD OF THE INVENTION

The present invention relates, in general, to static RAMs. More particularly, the invention relates to static RAMs with embedded test features.

BACKGROUND OF THE INVENTION

FIG. 1 illustrates a commonly-used six-transistor SRAM cell. A first inverter, comprising a P-channel transistor $T_1$ and an N-channel transistor $T_2$, and a second inverter, comprising a P-channel transistor $T_3$ and an N-channel transistor $T_4$, are interconnected in the familiar fashion to form a latch. An N-channel select transistor $T_5$ couples the latch to a first bit line BL and an N-channel select transistor $T_6$ couples the latch to a second bit line BL*. (The convention used throughout this document is that a signal or line marked with an "*" is, in normal operation, the logical complement of the signal or line having the same mnemonic, but lacking the "*".) The gates of $T_5$ and $T_6$ are coupled to a word line WL.

As is disclosed in U.S. Pat. No. 4,004,222, it is well known that testing SRAM cells by writing predetermined data to them and reading them after a waiting period is problematical. For various reasons, either the waiting period must be relatively long or some other measures, such as increasing the temperature, must be taken in order to increase the likelihood that defective cells will be identified by the test procedure. Any test techniques which require long waiting periods, high temperatures or other similar measures are unreasonably expensive.

Both U.S. Pat. No. 4,554,664 and U.S. Pat. No. 3,812,388 are directed to the design of latch circuits which might be useful in SRAM devices and which are said to be more easily testable than other such circuits. Neither, however, mentions either the problem of testing the data retention capability of such latch circuits nor a possible solution to the problem.

U.S. Pat. No. 4,680,762 is directed to the problem of testing semiconductor memory devices and is specifically directed to the problem of detecting "soft" cells in a dynamic RAM, or DRAM array. The disclosed method involves the application of a non-standard, time varying test signal to the word lines of the array and relies on the fact that certain "soft" DRAM cells reveal themselves by changing state under such conditions. The disclosed method and apparatus are not directed to the problem of testing SRAMs, dealing instead with DRAMs.

U.S. Pat. No. 4,685,086 is directed to the problem of detecting certain short-circuit type defects in SRAMs. In addition, a leakage current test is used. However, no method of detecting open-circuit type, or soft defects, is disclosed.

SUMMARY OF THE INVENTION

Accordingly, it is an object of the present invention to provide an improved SRAM with embedded test features.

It is a further object of the present invention to provide an improved apparatus and method for testing SRAMs.

Yet a further object of the present invention is to provide an apparatus and method for detecting defective SRAM cells which behave as functional DRAM cells.

These and other objects and advantages of the present invention are provided by a memory device comprising: a memory cell; a word line; a pair of complementary bit lines selectably coupled to said memory cell under control of said word line; means for controlling the state of one of said complementary bit lines; and means for sensing the state of the other of said complementary bit lines.

These and other objects and advantages of the present invention will be apparent to one skilled in the art from the detailed description below taken together with the drawings.

DETAILED DESCRIPTION OF THE INVENTION

Figure 1:
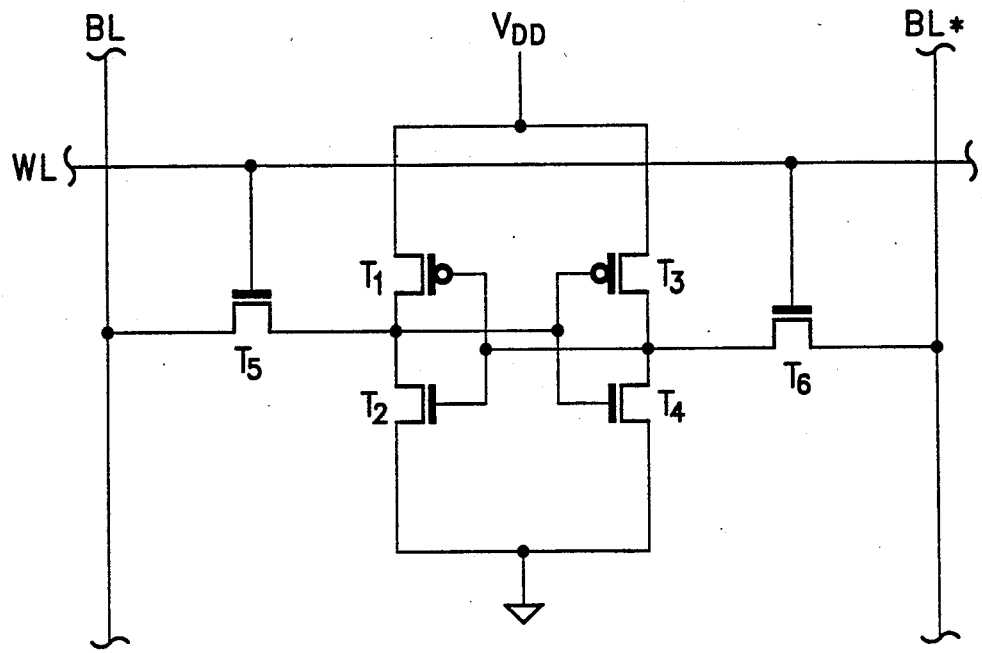
FIG. 1 is a schematic diagram of a six-transistor SRAM cell according to the prior art.
Figure 2A:
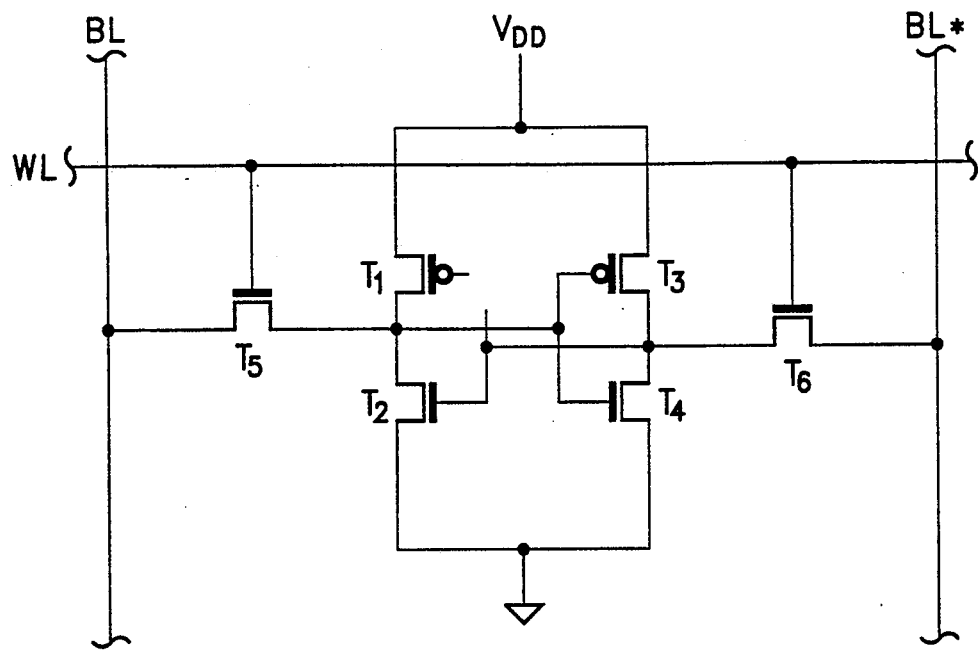
FIGS. 2A-2C are schematic diagrams illustrating potential soft defects in an SRAM cell of the type shown in FIG. 1.
Figure 2B:
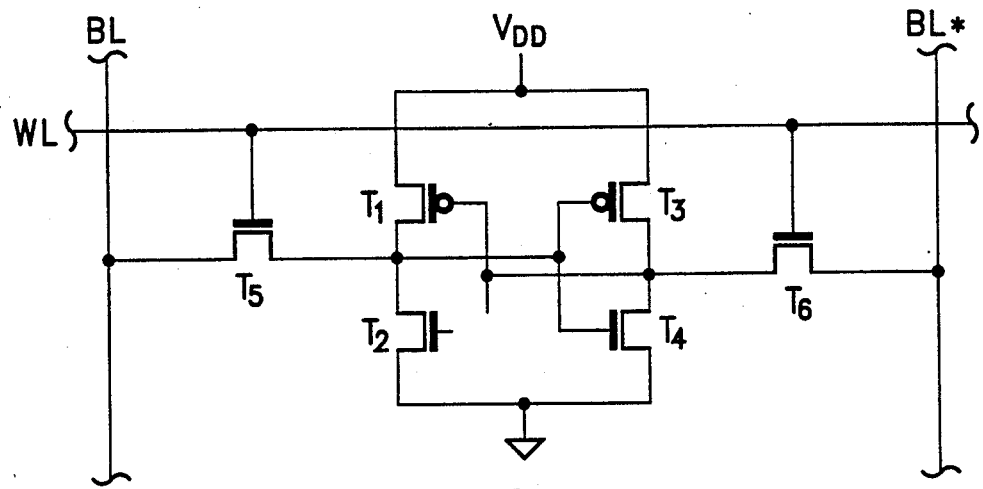
Figure 2C:
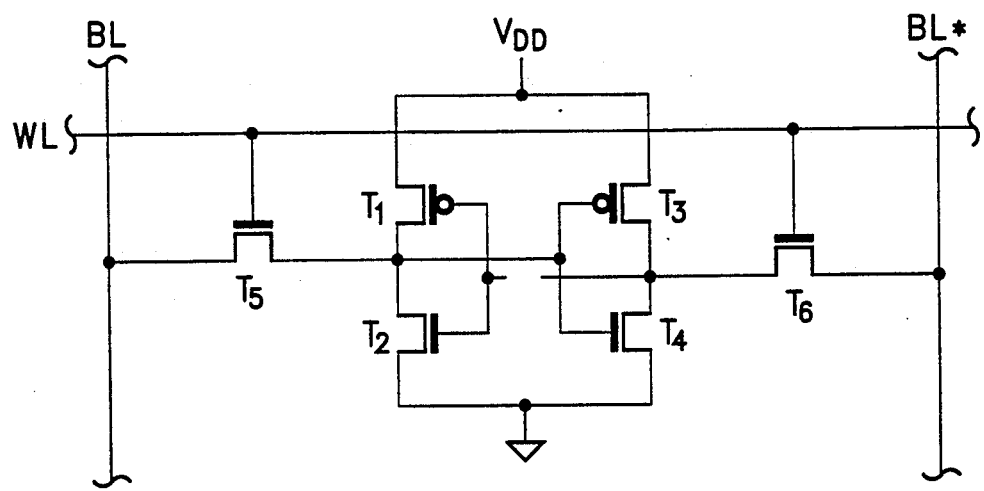

FIGS. 2A-2C illustrate three possible defects in an SRAM cell of the type shown in FIG. 1. All three involve one or more transistor gates which have been left "floating", or disconnected, by some flaw in the manufacturing process. In FIG. 2A, the gate of P-channel transistor $T_1$ is floating. An equivalent defect would be involved if the gate of P-channel transistor $T_3$ were left floating. In FIG. 2B, the gate of N-channel transistor $T_2$ is floating. An equivalent defect would be involved if the gate of N-channel transistor $T_4$ were left floating. Finally, in FIG. 2C, the defect is that the gates of both P-channel transistor $T_1$ and N-channel transistor $T_2$ are floating. The same defect would be involved if the gates of transistors $T_3$ and $T_4$ were both left floating. In the case of FIG. 2C, it is apparent that the two floating gates may be connected together, as shown, or may be independently floating.

The defects illustrated in FIGS. 2A–2C are relatively common due to the nature of high density, small geometry semiconductor fabrication technologies. A mis-patterned or incomplete conductive line, either of polysilicon or of metal, can easily cause such a defect. In addition, a mis-fabricated contact, or location where a conductive line connects to a gate or another conductive line, can cause this type of defect. As is known in the art, such defects may cause the SRAM cell to behave as a functional DRAM cell. That is, the only way to detect such defects has been to store a particular value in the cell and wait to see if the value is retained over some relatively long period of time. These defects are referred to hereinafter as "soft defects".

Figure 3:
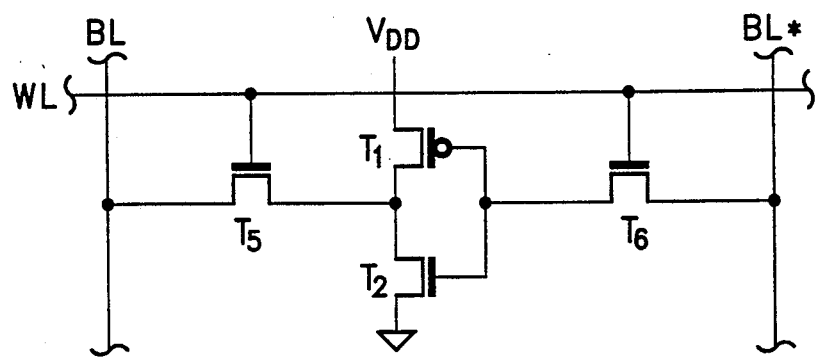
FIG. 3 is a schematic diagram illustrating a hypothetical circuit comprising one half of an SRAM cell of the type shown in FIG. 1.

FIG. 3 illustrates a portion of the SRAM cell of FIG. 1 comprising transistors $T_1$, $T_2$, $T_5$ and $T_6$. The SRAM cell can be analyzed for purposes of testing as comprising two halves, each having the structure illustrated in FIG. 3. A set of three simple procedures can be shown to fully test the inverter formed by $T_1$ and $T_2$ for the presence of soft defects. Of course, the same three procedures, appropriately applied, are capable of detecting soft defects in the other half of the SRAM cell.

The first soft defect detection procedure can be summarized as follows. First, bit line BL is precharged to a low logic state (i.e., its voltage is brought to a value below the threshold voltages of the transistors). Then, the output of the $T_1$-$T_2$ inverter is coupled to bit lines BL and BL* by driving word line WL to a high logic state (i.e., its voltage is driven to a value above the threshold voltages of the transistors), rendering transistors $T_5$ and $T_6$ conductive. Then bit line BL* is driven to a low logic state. Finally, the logic state of bit line BL is sensed.

The second soft defect detection procedure is similar to the first, but with the logical sense of the states of BL and BL* reversed. In other words, BL is precharged to a high logic state, then WL is driven to a high state, then BL* is driven to a high logic state and the state of BL is sensed.

As is apparent, the result of each of the first two procedures will be that the logic state of BL will change from its precharged state if the $T_1$-$T_2$ inverter is properly functioning. In other words, BL should be in a high state after the first procedure and in a low state after the second. A non-differential sense amplifier coupled to BL can provide an output indicative of the result of the tests.

The third soft defect detection procedure is designed to detect several instances of soft defects not detectable by the first two procedures, as is discussed more fully below. This procedure involves holding the state of BL* high and sensing the amount of current leaking through the $T_1$-$T_2$ inverter. A current sensor coupled into the $V_{DD}$ supply line for the SRAM cell detects if the leakage current exceeds a pre-selected limit, in which case the cell is identified as defective.

It can be shown that the first two test procedures described above are capable of detecting all possible soft defects except those in which the gate of $T_1$ is floating in a low state (referred to as the "stuck at zero" case) and those in which the state of the floating gate or gates causes bit line BL to settle at a voltage within the uncertainty margin of the non-differential sense amplifier used to detect its state.

In the P-channel, stuck at zero case, one would expect that the second test procedure would detect the defect. However, in standard CMOS processes the N-channel gate width and carrier mobility are both greater than is the case for the P-channel devices. This implies that $T_2$ will overcome $T_1$ and pull BL low, resulting in a failure to detect the soft defect.

Any sense amplifier will have switching characteristics which include some input voltage range for which the output of the sense amplifier is uncertain. For instance, a non-differential sense amplifier designed to switch its output when its input passes through 3 volts may, in fact, have an uncertain output whenever its input is in the range of 2.9 to 3.1 volts.

Consider, for example, the first soft defect detection procedure in a case in which the gate of $T_1$ is floating at some voltage near its threshold voltage. If $T_1$ conducts just enough to bring the voltage of BL into the range of 2.9 to 3.1 volts during the test procedure, the result of the test will be inconclusive. In other words, the test is not sufficient to reliably detect soft defects under certain circumstances.

It is possible to select the switch point of the non-differential sense amplifier used to sense bit line state during the test procedures so that its uncertainty range is roughly in the middle of the voltage range defined by $V_{DD}$ and ground. This implies that, in order for the final voltage of BL to be within the uncertainty range of the sense amplifier, the gate of at least one of the transistors ($T_1$ or $T_2$) must be floating at or near its threshold voltage. If this is the case, the leakage current through the $T_1$-$T_2$ inverter will be significantly higher than would be the case if both gates were properly connected.

It is apparent that the third soft defect detection procedure described above, the current sense test, will detect both the P-channel, stuck at zero defect and those defects which are undetectable due to sense amplifier uncertainty. In any of these cases, the leakage current through the inverter will be significantly higher than would be the case if both transistors' gates were properly connected. In fact, the leakage current through a single defective inverter will be detectably greater than the normal leakage through an entire array of SRAM cells.

FIG. 3 and the description above relate to procedures for testing what may be thought of as the "left half" of the SRAM cell of FIG. 1 for the presence of soft defects. As is apparent, the same tests may be applied with the roles of BL and BL* reversed to test the "right half" of the cell for soft defects.

In order to perform the test procedures described above in a practical SRAM device, one must be able to: (1) "write to" each bit line independently of its complementary bit line, (2) sense the state of, or "read" each bit line after (or perhaps while) its complementary bit line has been "written to" in accordance with step (1), and (3) sense the leakage current of the array of SRAM cells while writing any pattern and its complement to the array in the normal fashion. The use of the terms "read" and "write" in the first two cases is not the standard usage of these terms in the art of memory devices, as is apparent to one skilled in the art. A fourth capability which may be necessary in some but not all memories is that of independently "precharging" each bit line either high or low. This may be necessary in order to reliably detect the bit line state transition, or lack thereof, which indicates the absence, or presence, of soft defects.

Figure 4:
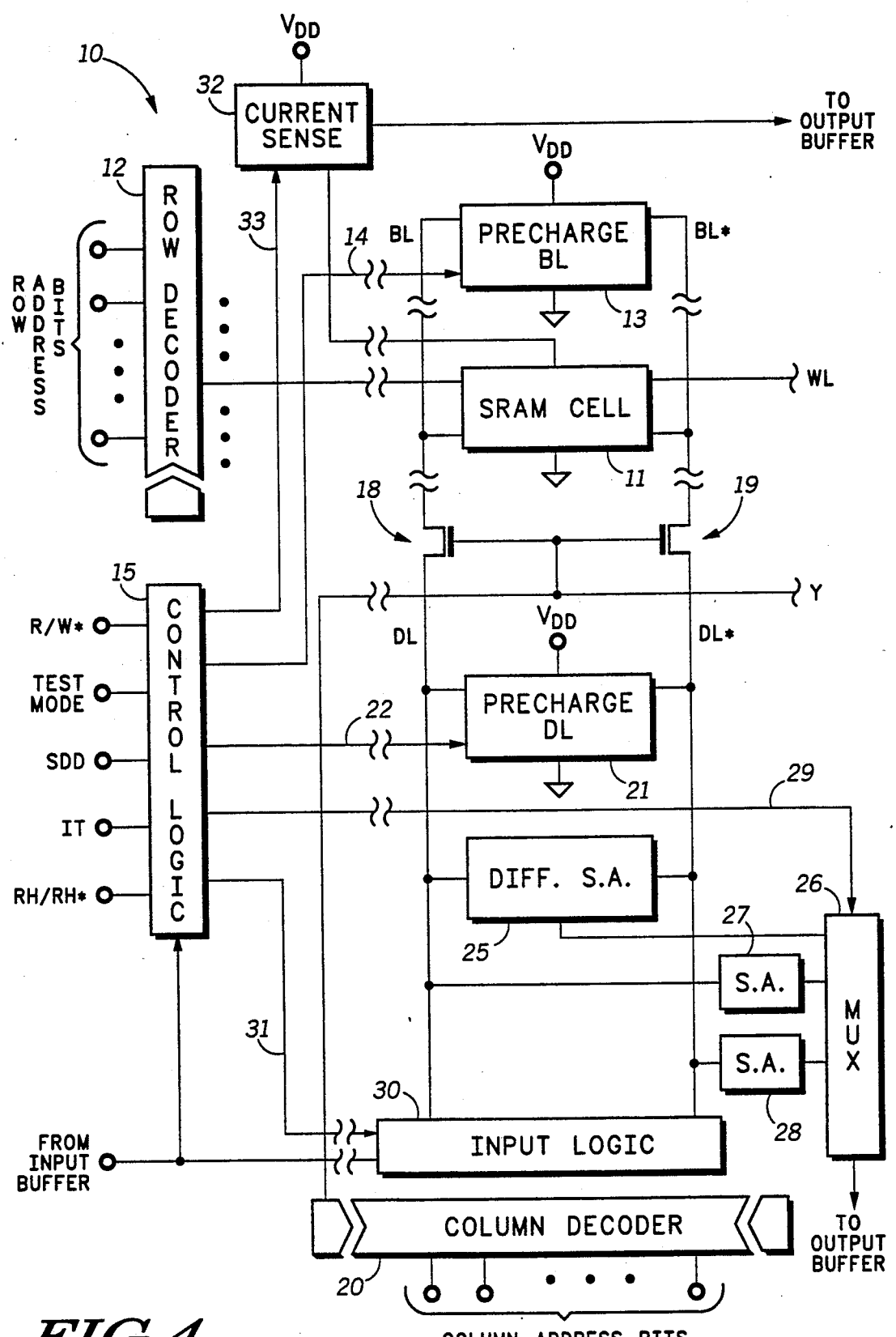
FIG. 4 is a block diagram illustrating a portion of a memory device according to a particular embodiment of the present invention.

FIG. 4 illustrates a portion of a memory device 10 which, according to a particular embodiment of the present invention, has embedded test features for soft defect detection. An SRAM cell 11, preferably of the type illustrated in FIG. 1, comprises one of a plurality of such cells in device 10. SRAM cell 11 is coupled to a word line WL, which comprises one of a plurality of such word lines emanating from row decoder 12. Row decoder 12 receives inputs comprising a plurality of row address bits and selects one or more word line in response thereto, in the fashion familiar in the art.

If word line WL is selected by row decoder 11, SRAM cell 11 is thereby coupled to each of a pair of complementary bit line BL and BL*. Complementary bit line pair BL and BL* comprise one of a plurality of complementary bit line pairs of memory device 10. Bit lines BL and BL* are each coupled to a bit line precharge apparatus 13, which is capable of precharging bit lines BL and BL* to high or low logic states. Bit line precharge apparatus 13 is coupled by means of one or more control lines 14 to control logic 15, which controls the logic sense and timing of the operation of bit line precharge apparatus 13. There would normally be one bit line precharge apparatus 13 for each pair of complementary bit lines in memory device 10, although this is not the only possible implementation.

Bit lines BL and Bl* are also coupled, through column select transistors 18 and 19, respectively, to a pair of complementary data lines DL and DL*, respectively. Data lines DL and DL* comprise one of a plurality of complementary data lines pairs of memory device 10. (Unless, of course, memory device 10 is "by-one" or bit organized device which produces a single bit of output data for each address accessed in a read cycle. In this case, there is normally only one data line pair.) The gates of column select transistors 18 and 19 are connected to a column select line Y which comprises one of a plurality of such lines emanating from column decoder 20. Column decoder 20 receives inputs comprising a plurality of column address bits and selects one or more column select lines in response thereto, in the fashion familiar in the art.

Data lines DL and DL* are each coupled to a data line precharge apparatus 21, which is capable of precharging data lines DL and DL* to high or low logic states. Data line precharge apparatus 21 is coupled by means of one or more control lines 22 to control logic 15, which controls the logic sense and timing of the operation of data line precharge apparatus 21. There would normally be one data line precharge apparatus 21 for each pair of complementary data lines in memory device 10, although this is not the only possible implementation.

A differential sense amplifier 25 is coupled to each of data lines DL and DL*. Differential sense amplifier 25 provides the sensing during normal reading of memory device 10 and provides an output to a multiplexer 26. A first non-differential sense amplifier has an input connected to data line DL and provides an output to multiplexer 26. A second non-differential sense amplifier 28 has an input connected to data line DL* and provides an output to multiplexer 26. Multiplexer 26 is coupled by one or more control lines 29 to control logic 15. Multiplexer 26 selects, under control of control logic 15, one of differential sense amplifier 25, non-differential sense amplifier 27 and non-differential sense amplifier 28 and couples the output of the selected sense amplifier to the output buffer of memory device 10.

Data lines DL and DL* are also coupled to input logic 30. Input logic 30 receives an input from the input buffer of memory device 10 and is coupled by means of one or more control lines 31 to control logic 15. Input logic 30 provides those functions necessary for normal writing of data to SRAM cell 11 (and all other cells coupled to data lines DL and DL*) and also provides for the individual control over bit line states necessary for performing the soft defect detection procedures described above. Control logic 15 also has a data input coupled to the input buffer.

A current sense apparatus 32 is coupled between a source of positive voltage $V_{DD}$ and SRAM cell 11. Current sense apparatus 32 is also coupled to control logic 15 by means of one or more control lines 33. Current sense apparatus 32 has an output coupled to the output buffer of memory device 10 and provides the means for implementing the third soft defect detection procedure described above.

Control logic 15 receives a plurality of control signals and procdures the necessary control and timing signals to operate the remainder of the illustrated apparatus. Among the control signals received by control logic 15 are a read/write signal (R/W*), a test mode signal (TEST MODE), a soft defect detect signal (SDD), a current test signal (IT) and a right-hand/left-hand signal (RH/RH*).

The read/write control signal is a conventional control signal for memory devices and is used to designate a particular access of device 10 as either a read or a write access. The test mode control signal is used to indicate that memory device 10 is to be accessed in a test mode. Most if not all memory devices have such test modes in which patterns of data may be quickly written into and read from the device for test purposes. The soft defect detect signal is used, in conjunction with the test mode signal, to direct that the first two soft defect detection procedures described above be performed. The current test signal is used, in conjunction with the test mode signal, to direct that the third soft defect detection procedure described above be performed.

The operation of memory device 10 when none of the test mode signals are active, or when only the TEST MODE signal is active, is not substantially different from prior art SRAM devices and will be summarized only briefly here. In this particular embodiment of the invention, an apparatus not shown in FIG. 4 detects address transitions and triggers bit line and data line precharging. In response to the address transition detection, control logic 15 directs bit line precharge apparatus 13 and data line precharge apparatus 21 to precharge bit lines BL and BL* and data lines DL and DL*, respectively, to a high logic state.

Meanwhile, row decoder apparatus 12 and column decoder apparatus 20 are determining which word line and Y-select line, respectively, to select in response to the new address. In addition, control logic 15 examines the state of the R/W* signal to determine whether the current access is a read or a write. For a read access, control logic 15 merely directs multiplexer 26 to couple the output of differential sense amplifier 25 to the output buffer after a predetermined time (typically measured from the selection of the word and column select lines) has elapsed. On a write access, control logic 15 directs input logic 30 to drive BL to a state identical to the state of the input buffer and to drive BL* to the opposite state, again with appropriate timing.

Any access which takes place while the TEST MODE and SDD signals are both active triggers control logic 15 to execute one of the first two soft defect detection procedures. If the RH/RH* signal is high, the "right half" of the cells or cells accessed is tested. If RH/RH* is low, the "left half" is tested. The value of the data in the input buffer is used by control logic 15 to determine whether the first or second procedure is to be executed.

An example is illustrative of the soft defect detection procedure. Assume that RH/RH* is low and that the value in the input buffer is high. Control logic 15 directs precharge apparatus 13 to precharge bit lines BL and BL* to a high logic state and directs precharge apparatus 21 to similarly precharge data line DL and DL*. Next, the appropriate word line and Y-select line are driven high by row decoder 12 and column decoder 19, respectively. Then control logic 15 directs input logic 30 to drive data line DL* to a high state, but not to drive any state onto data line DL. Finally, control logic 15 directs multiplexer 26 to couple non-differential sense amplifier 27 to the output buffer of device 10.

As is apparent to one skilled in the art from the example, executing the first two soft defect detection procedures with the disclosed apparatus is as simple as "writing" any pattern of data to device 10 first with RH/RH* held high, then "writing" the complement of the pattern to device 10 with RH/RH* held high, then repeating the first two steps with RH/RH* held low (all, of course, with TEST MODE and SDD active). Immediately after each "write", the output buffer should contain the complement of the data just "written".

An access to device 10 while TEST MODE and IT are both active directs control logic 15 to perform the third, or current test, soft defect detection procedure. The access proceeds as a normal write access, with both data lines and bit lines precharged high and normal row and column decoding and selecting. Input logic 30 is directed to drive the data value in the input buffer onto data line DL and its complement onto DL*, as in a normal write. However, control logic 15 directs multiplexer 26 to couple none of the three sense amplifiers to the output buffer. Instead, current sense apparatus 32 is enabled to sense the leakage current through the selected cell or cells and to place a predetermined value in the output buffer if the predetermined threshold value is exceeded. Thus, in order to test the entire device, the user simply writes any pattern of data to device 10, then writes its complement, and examines the contents of the output buffer after each write to determine whether the leakage current exceeded the predetermined threshold (all, of course, with TEST MODE and IT active).

Figure 5:
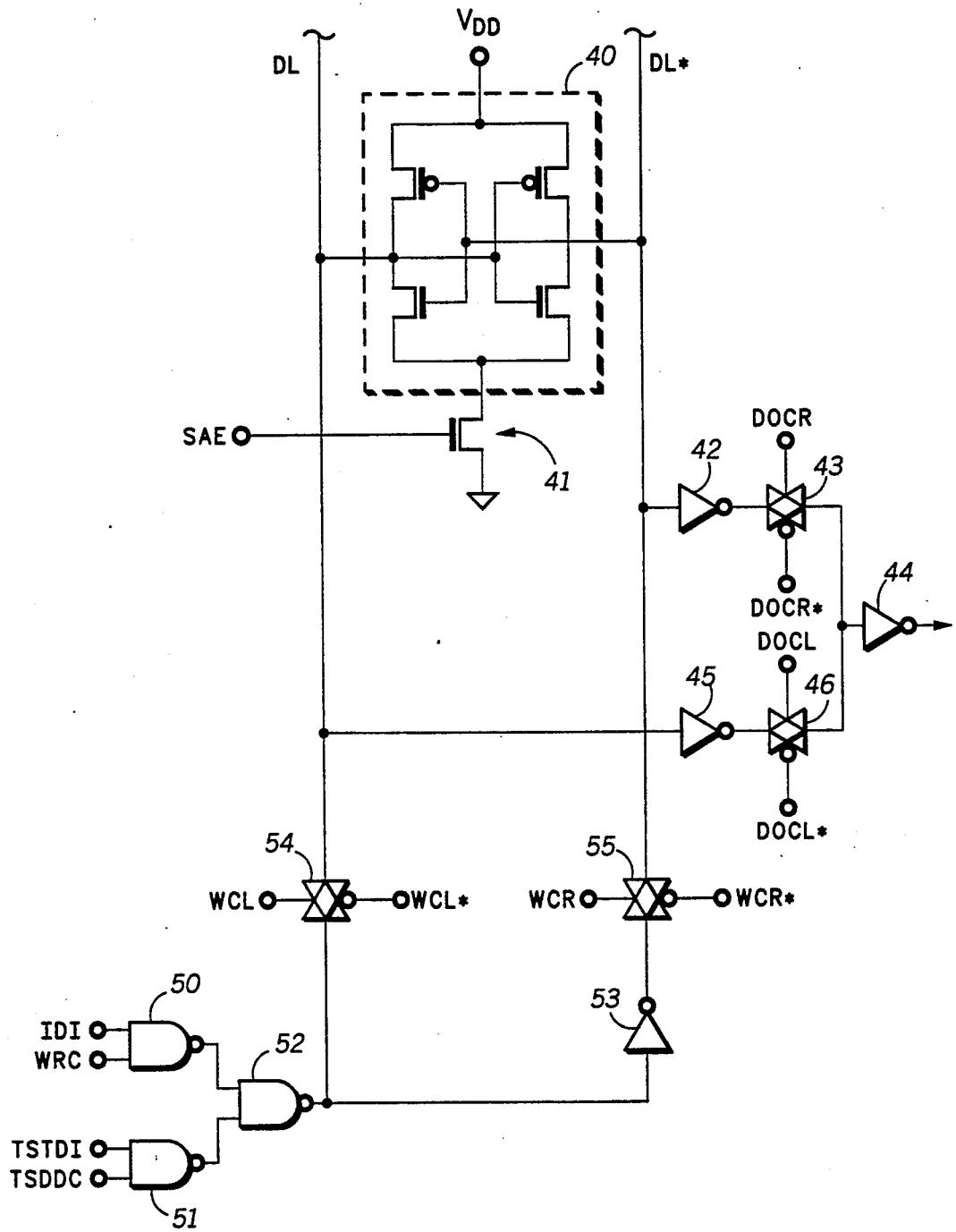
FIG. 5 is a detailed schematic diagram of a portion of a preferred embodiment of the apparatus of FIG. 4.

FIG. 5 illustrates a portion of the apparatus of FIG. 4 which is designed according to a preferred embodiment of the present invention. This particular apparatus is an efficient design of the input logic, sense amplifiers and sense amp multiplexer which is functionally identical to the conceptual apparatus of FIG. 4. FIG. 5 illustrates in greater detail the design of a fairly typical differential sense amplifier 40 which is coupled between data line DL and data line DL*. An N-channel transistor 41 has a source coupled to sense amplifier 40 and a drain coupled to ground. A gate of transistor 41 is coupled to a control signal SAE (for Sense Amp Enable).

A first non-differential sense amplifier 42, which is simply an inverter, has an input coupled to data line DL*. An output of sense amplifier 42 is coupled through a transmission gate 43 to an input of an inverter 44. A complementary pair of control signals DOCR and DOCR* (for Data Output Control Right) are coupled to and control transmission gate 43. A second non-differential sense amplifier 45, which is also simply an inverter, has an input coupled to data line DL and an output coupled through a transmission gate 46 to the input of inverter 44. A complementary pair of control signals DOCL and DOCL* (for Data Output Control Left) are coupled to and control transmission gate 46.

The output of inverter 44 is coupled to the output buffer of the memory device. In normal and normal test modes, only transmission gate 46 is opened. Thus, non-differential sense amplifier 45 simply acts as an inverting buffer during normal reads.

In a soft defect detection test, SAE will be held low to disable differential sense amplifier 40. In addition, only one of transmission gates 43 and 46 will be opened at any one time, depending on the state of the RH/RH* control signal. For example, if RH/RH* is high, indicating that the "right half" of the cell or cells being tested is under scrutiny, then transmission gate 43 will be opened and transmission gate 46 will be closed. This couples only the output of non-differential sense amplifier 42 to the output buffer.

The input logic portion of the apparatus of FIG. 5 comprises a first NAND gate 50 having a pair of inputs and an output, a second NAND gate 51 also having a pair of inputs and an output, a third NAND gate 52 having a pair of inputs coupled to the outputs of NAND gates 50 and 51, respectively, a transmission gate 54 coupled between the output of NAND gate 52 and data line DL, an inverter 53 having an input coupled to an output of NAND gate 52 and a transmission gate 55 coupled between the output of inverter 53 and data line DL*.

A first input of NAND gate 50 is coupled to a signal IDI (for Input Data In), which originates in the input buffer of the memory device. A second input of NAND gate 50 is coupled to a control signal WRC (for Write Control). The signals IDI and WRC are used during normal write accesses of the memory device.

A first input of NAND gate 51 is coupled to a signal TSTDI (for Test Data In). A second input of NAND gate 51 is coupled to a control signal TSDDC (for Test Soft Defect Detection Control). The signals TSTDI and TSDDC are used during soft defect detection accesses of the memory device.

Transmission gate 54 is coupled to and controlled by a pair of complementary control signals WCL and WCL* (for Write Control Left). Similarly, transmission gate 55 is coupled to and controlled by a pair of complementary control signals WCR and WCR* (for Write Control Right). As is apparent, both transmission gates 54 and 55 will be opened during normal write accesses of the memory device. One or the other of these transmission gates will be opened during soft defect detection accesses of the memory device, depending on the state of the RH/RH* control signal.

The control logic necessary to produce the various required control signals and the like will vary greatly depending on the particulars of the design of any memory device. In a particular embodiment of the present invention, an array of SRAM embodying the principles of the present invention forms a portion of an integrated circuit microcomputer. In this embodiment, a control register is used for controlling the access mode, whether the SRAM is enabled, its location in the memory map of the microcomputer and other items. Several bits of this control register are dedicated to controlling the soft defect detection operation of SRAM array. In stand-alone memory devices, one could either incorporate such a register into the design or dedicate several pins to the task of supplying the necessary soft defect detection control signals.

In the preferred embodiment of the present invention, the various control signals are timed so that, during soft defect detection, the state of one of the bit lines is being sensed simultaneously with the forcing of the other bit line to a predetermined state. In other words, in the context of FIG. 5, transmission gates 54 and 43 would be open simultaneously during a soft defect detection access in which RH/RH* is high. This illustrates one sense in which the "writes" and "reads" of the soft defect detection tests differ from the conventional usage of those terms. In fact, in the preferred embodiment, the R/W* control signal is always high, indicating a read access, during soft defect detection tests.

Figure 6:
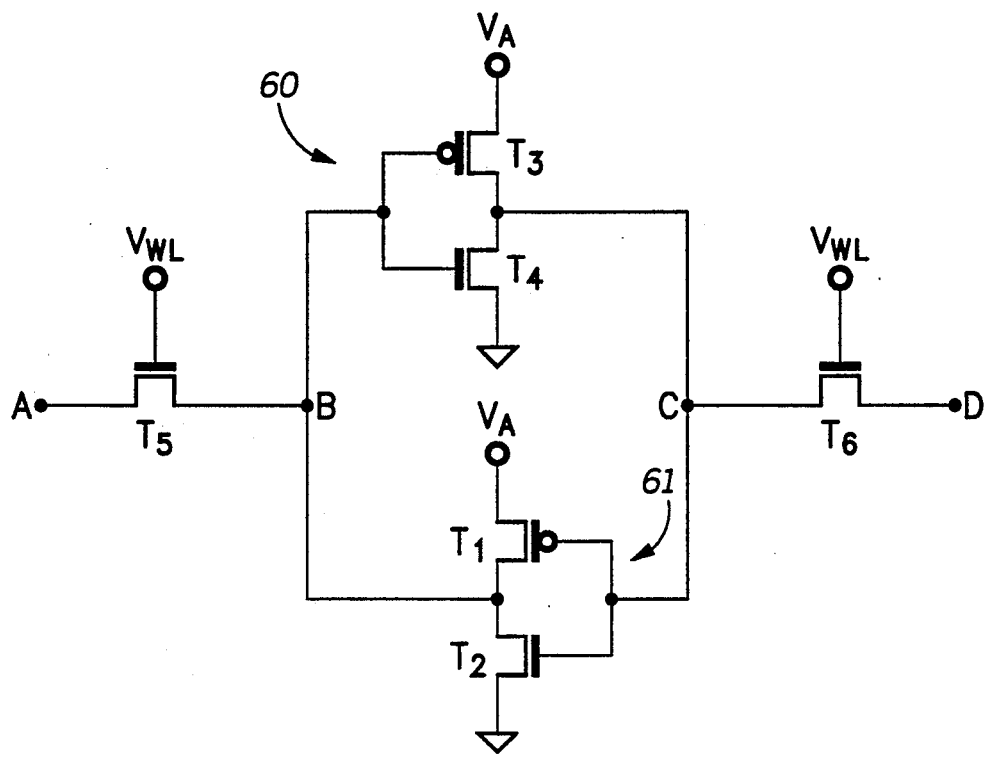
FIG. 6 is a schematic diagram of a six-transistor SRAM cell illustrating power supply connections thereto.

Referring now to FIG. 6, the basic six-transistor SRAM cell is reillustrated for purposes of discussing a modification to the embodiments of the invention described above. FIG. 6 differs from FIG. 1 only to the extent necessary to illustrate the point. In this view, the positive power supply voltage connected to the two inverters is labelled $V_A$ and the voltage applied to the gates of the select transistors is labelled $V_{WL}$, for reasons which will become apparent. In the foregoing description, it was assumed that both $V_A$ and $V_{WL}$ were approximately equal to $V_{DD}$.

As described above, the method for detecting soft defects in inverter 60, for instance, involves, inter alia, precharging node D to a high state, selecting this cell by driving $V_{WL}$ to a high state so as to turn on $T_5$ and $T_6$, then driving node A high and determining whether node D transitions to a low state. This will determine whether transistor $T_4$ or the connections thereto are defective. However, if the effect of inverter 61 on this process is considered, a possible problem is apparent: since node C is high, transistor $T_2$ will be conductive, creating a path for current to flow from node A through transistors $T_5$ and $T_2$ to ground. In other words, $T_2$ will act as a voltage clamp and tend to prevent node B from going high. Transistors $T_5$ and $T_2$ will form a voltage divider circuit which will cause the voltage at node B to rise only to a value determined by the ratio of the resistances of the two transistors. If the ratio of the resistance of $T_5$ to the resistance of $T_2$ is sufficiently high, the voltage at node B will stay below the switchpoint of inverter 60. In this case, node D will not transition to a low state and transistor $T_4$ will appear to be defective (a false positive test result).

As is well known, the resistance of an MOS transistor (at a given gate voltage) is determined in large part by its size (the length and width of its gate). Therefore, one way to alleviate the clamping problem is to reduce the ratio of the sizes of transistors $T_5$ and $T_2$ to as great an extent as possible. However, for various reasons relating to the operability of the cell for its intended purpose, it will be appreciated that one cannot ratio the sizes of these transistors without limitation. Therefore, it is most often not possible to eliminate the clamping problem by size ratioing alone.

In general, the size ratios $T_6/T_4$, $T_3/T_6$ and $T_1/T_5$ can, if sufficiently large, result in false positive test results for the tests of transistors $T_2$, $T_1$ and $T_3$, respectively. However, it is typical that P-channel transistors, such as $T_1$ and $T_3$, are relatively weak (i.e.: small), compared to the N-channel transistors, such as $T_5$ and $T_6$. Thus, normal circuit layout conventions will most commonly avoid the voltage clamping problem in these cases. At any rate, the method disclosed below provides a solution for all of these cases.

According to a particular embodiment of the present invention, a method is employed whereby a voltage lower than $V_{DD}$ is applied to the cells during the soft defect detection procedure. That is, $V_A$ is less than $V_{WL}$ during the soft defect detection procedure. It has been found that this technique can substantially alleviate the voltage clamping problem and permit accurate soft defect detection testing.

Figure 7:
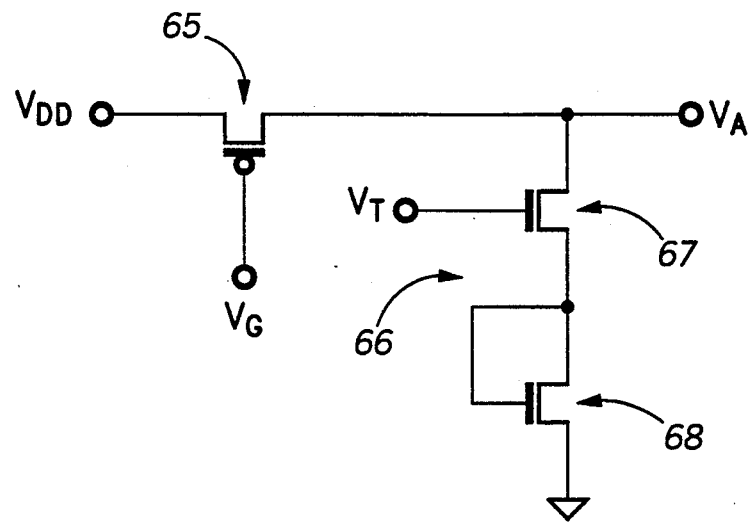
FIG. 7 is a schematic diagram illustrating an array power supply control circuit according to a particular embodiment of the present invention.

Referring now to FIG. 7, a circuit suitable for producing $V_A$ from $V_{DD}$ is described. A source of a P-channel transistor 65 is connected to $V_{DD}$, while a drain of transistor 65 is connected to $V_A$. A gate of transistor 65 is connected to a control voltage $V_G$. A constant current circuit 66, comprising an N-channel transistor 67 and an N-channel transistor 68, is connected between $V_A$ and ground. A drain of transistor 67 is connected to $V_A$ and a gate of transistor 67 is connected to a control voltage $V_T$. A source of transistor 67 is connected to a drain and a gate of transistor 68. A source of transistor 68 is connected to ground. In normal (i.e.: non-test) modes of operation, $V_G$ and $V_T$ are both low, making transistor 65 conductive and transistor 67 non-conductive. In this state, $V_A$ is substantially equal to $V_{DD}$. While soft defect detection tests are underway (although not necessarily during the current sense portion of the procedure), $V_G$ and $V_T$ are high, rendering transistor 65 resistive and transistor 67 conductive. The current drawn through constant current circuit 66 induces a voltage drop across transistor 65, assuring that $V_A$ is less than $V_{DD}$. In this case, the amount by which $V_A$ is less than $V_{DD}$ is determined by the sizes of transistors 65 and 68.

A slight modification to the circuit of FIG. 7 involves connecting the gate of transistor 65 to its drain (i.e.: to the $V_A$ node of the circuit). This provides for an additional voltage drop, due to the threshold voltage of transistor 65, between $V_{DD}$ and $V_A$. The control voltage $V_T$ might correspond, for instance, to the SDD control signal described above with reference to FIG. 4.

Figure 8:
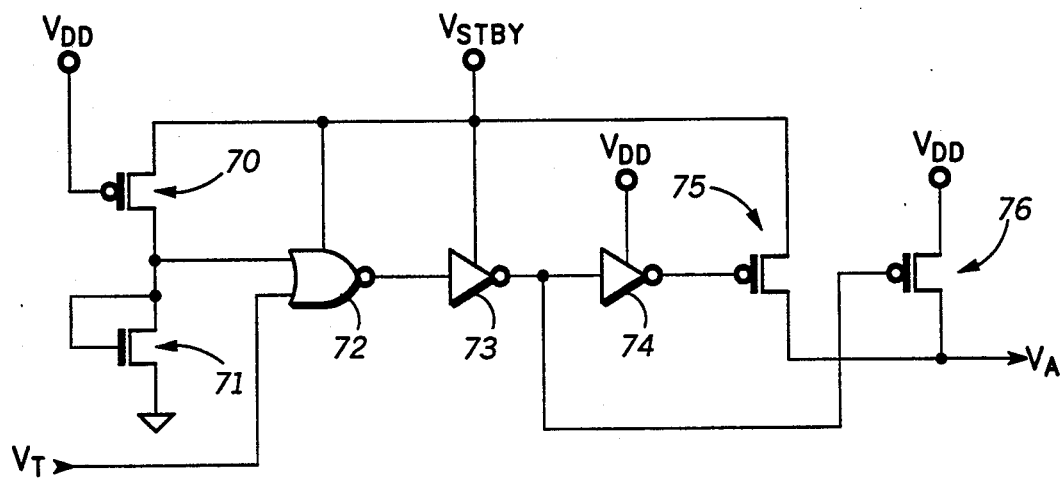
FIG. 8 is a schematic diagram illustrating an alternate array power supply control circuit according to another embodiment of the present invention.

Referring now to FIG. 8, an alternate circuit for providing an array supply voltage $V_A$ is illustrated. The circuit of FIG. 8 is useful in circumstances in which there is a separate standby power supply input $V_{STBY}$ for the circuit. Many microcomputers containing SRAM memories, for instance, have a separate standby power supply to save the contents of the SRAM while the remainder of the microcomputer is powered down. The circuit of FIG. 8 provides both for automatic switching between $V_{DD}$ and $V_{STBY}$ when $V_{DD}$ begins to drop and for allowing $V_{STBY}$ to control $V_A$ during a soft defect detection procedure. This allows an apparatus external to the SRAM circuit (a tester, for instance) to control the array power supply voltage level independently of $V_{DD}$ during the soft defect detection procedure.

A P-channel transistor 70 has a gate connected to $V_{DD}$ and a source connected to $V_{STBY}$. A drain of transistor 70 is connected to a drain and a gate of an N-channel transistor 71. A source of transistor 71 is connected to ground. A NOR gate 72 has one input connected to the drain of transistor 70 and to the gate and drain of transistor 71. The other input of NOR gate 72 is connected to a control signal $V_T$. A power supply for NOR gate 72 is connected to $V_{STBY}$. A output of NOR gate 72 is connected to an input of an inverter 73, whose power supply is also connected to $V_{STBY}$. An output of inverter 73 is connected to an input of an inverter 74, whose power supply is connected to $V_{DD}$. An output of inverter 74 is connected to a gate of a P-channel transistor 75. A source of transistor 75 is connected to $V_{STBY}$ and a drain of transistor 75 is connected to an output of the circuit, $V_A$. A drain of a P-channel transistor 76 is connected to $V_A$, a source of transistor 76 is connected to $V_{DD}$ and a gate of transistor 76 is connected to the output of inverter 73.

First, assume that $V_T$ is low; that is, the device is in a non-test mode of operation. As long as $V_{DD}$ remains above or approximately equal to $V_{STBY}$, transistor 70 will remain non-conductive. The current drawn through transistor 71 will cause a voltage drop across transistor 70, keeping its drain at a voltage below the switchpoint of NOR gate 72. Thus, the output of NOR gate 72 will be high, the output of inverter 73 will be low and the output of inverter 74 will be high. Transistor 75 will be non-conductive and transistor 76 will be conductive. Therefore, $V_A$ will be approximately equal to $V_{DD}$ and power required for the memory array will be drawn from $V_{DD}$ through transistor 76.

If $V_{DD}$ drops to approximately one threshold voltage below $V_{STBY}$, transistor 70 will start to become conductive and the voltage drop across it will decrease, raising its drain voltage to a level above the switchpoint of NOR gate 72. The output of NOR gate 72 will become low, the output of inverter 73 will become high and the output of inverter 74 will become low. Now, transistor 75 will be conductive and transistor 76 will be non-conductive. Therefore, $V_A$ will be approximately equal to $V_{STBY}$ and power required for the memory array will be drawn from $V_{STBY}$ through transistor 75.

Assume now that $V_T$ is high; that is, the circuit is in a test mode. ($V_T$ may be, for instance, the SDD control signal described above with reference to FIG. 4) Regardless of the relationship between $V_{DD}$ and $V_{STBY}$, the output of NOR gate 72 will be low, the output of inverter 73 will be high and the output of inverter 74 will be low. $V_A$ will be approximately equal to $V_{STBY}$ and power required for the memory array will be drawn from $V_{STBY}$ through transistor 75. Since $V_{STBY}$ is controllable separately from $V_{DD}$ by an external circuit, $V_A$ can be set to a level below $V_{DD}$ during the soft defect detection procedure.

In the preferred embodiment of the present invention, illustrated in FIGS. 9-14, the power supply switching and array power supply generation circuits are combined with circuits useful for implementing the current sense test on-chip. However, one skilled in the art will appreciate that the concept of lowering the array power supply voltage during the soft defect detection procedure can be accomplished in a large number of widely different ways.

Figure 9:
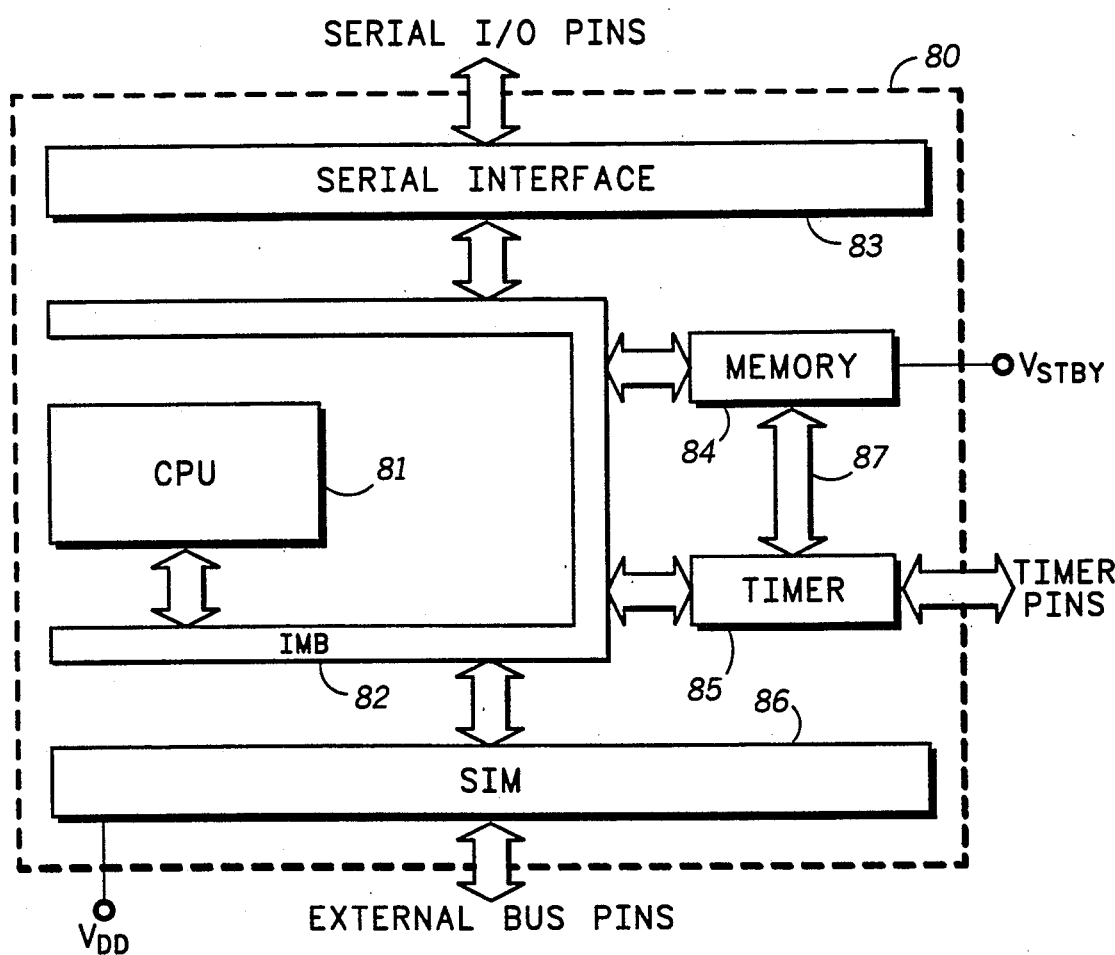
FIG. 9 is a block diagram of an integrated circuit microcomputer comprising a preferred embodiment of the present invention.

Referring now to FIG. 9, an integrated circuit microcomputer 80 is illustrated. Microcomputer 80 comprises a central processing unit (CPU) 81, an inter-module bus (IMB) 82, a serial communication interface 83, on-board memory module 84, a timer module 85 and a system integration module (SIM) 86. Inter-module bus 82, which comprises multiple data, address and control signal lines, is coupled to and provides for communication between CPU 81 and each of the other components of microcomputer 80. In addition, it is possible for a bus master other than CPU 81 to control IMB 82 and, thereby, to communicate with the various modules of microcomputer 80 independently of CPU 81. Serial interface 83 provides for synchronous and/or asynchronous serial data transfer between microcomputer 80 and external devices and systems by means of several serial I/O pins. Memory module 84 provides storage space for instructions and other data useful to microcomputer 80. Timer module 85 provides various timing functions such as input capture, output compare and the like by means of several timer pins. Timer 87 is a separately micro-programmable machine and, for purposes of code development therefor, is connected to memory module 84 by means of an emulation bus 87. SIM 86 provides an interface between IMB 82 and an external bus and also provides certain system functions such as clock signal generation and distribution and test mode control.

The main power supply for microcomputer 80, $V_{DD}$, is shown here connected to SIM 86, although it could be just as accurately shown as directly connected to each module individually. A separate, standby power supply, $V_{STBY}$, is connected to memory module 84 and is intended to provide standby power to retain the contents of memory module 84 if $V_{DD}$ fails or is removed.

Memory module 84 is an SRAM memory which is designed to implement the defect detection techniques described above. SIM 86 contains test circuits which control, inter alia, entry into a test mode. One of the signal lines of IMB 82 (referred to as TEST MODE) is used by SIM 86 to signal to all of the other modules of microcomputer 80 that the test mode is active.

Memory module 84 includes a test mode control register (not illustrated) comprising eight bits. Some of the bits of the test mode control register, together with the state of the TEST MODE line of IMB 82, operate to control the implementation of the soft defect detection tests of memory module 84. Table I summarizes the functions of the relevant bits of the test mode control register.

TABLE I

| BIT NAME | BIT LOCATION | FUNCTION |
|---|---|---|
| RTIT | 15 | Enables current sense test when set |
| RTII | 14 | Enables preconditioning when set |
| RTSTD | 13 | Input data for soft defect detection |
| RTRH | 12 | Selects right or left inverter for SDD |
| RTSDD | 11 | Enables SDD when set |
| RTC1 | 10 | High bit of delay counter |
| RTC0 | 09 | Low bit of delay counter |

RTIT, RTRH and RTSDD correspond approximately to the IT, RH/RH* and SDD control signals described above with reference to FIG. 4. RTII enables a preconditioning procedure which prepares memory module 84 for the current sense test, as is further described below. RTSTD provides control over the input data for the soft defect detection procedure. RTC1 and RTC0 provide control over a variable delay time which is added to the normal sensing delay during the soft defect detection procedure. The bit locations referred to in Table I reflect the fact that the test mode control register comprises the upper byte of a sixteen bit register. The test mode control register is accessible via IMB 82 by any master thereof, either CPU 81 or an external bus master such as a test system.

Figure 10:
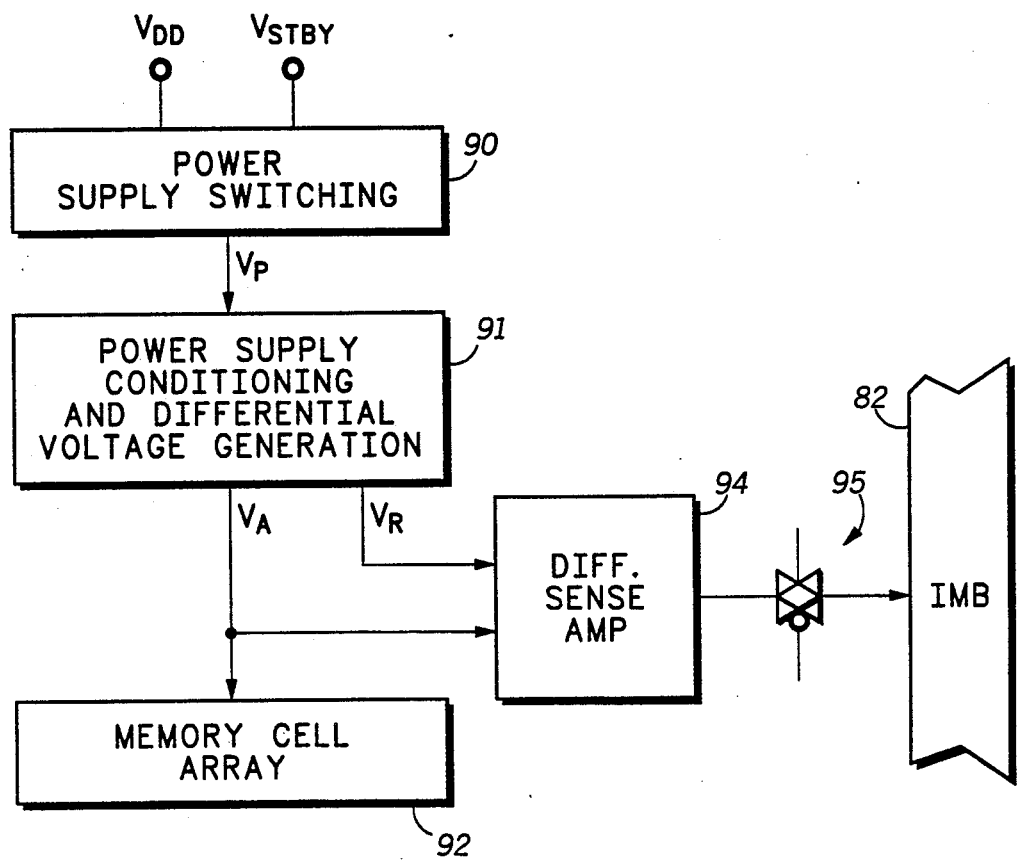
FIG. 10 is a block diagram illustrating the power supply and leakage current sensing portions of a preferred embodiment of the present invention.

Referring now to FIG. 10, the power supply and leakage current testing portions of memory module 84 are illustrated in block diagram form. $V_{DD}$ and $V_{STBY}$ are both connected as inputs to a power supply switching circuit 90, which selects one of the two power supplies and provides a power supply output $V_P$. The power supply output of circuit 90 is connected as an input to a power supply conditioning and differential voltage generation circuit 91, which provides the array power supply voltage $V_A$ at one output and a reference voltage $V_R$ at another output. The array power supply voltage $V_A$ is connected as power inputs to a memory cell array 92 and to a differential sense amplifier 94. The reference voltage $V_R$ is also connected as an input to differential sense amplifier 94, whose output is gated through a transmission gate 95 onto IMB 82. The details and functions of each of these circuits is described below with reference to FIGS. 11-14.

Figure 11:
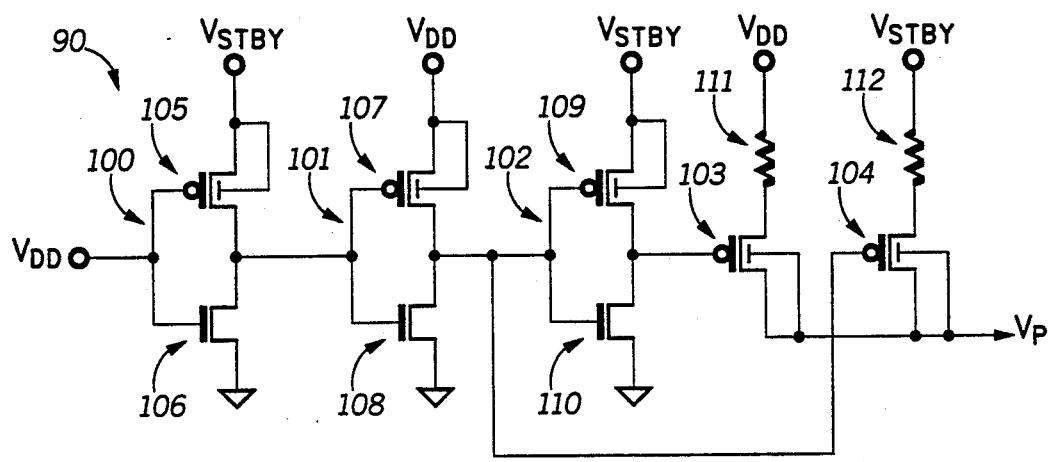
FIG. 11 is a schematic diagram illustrating a portion of the apparatus illustrated in FIG. 10.

Referring now to FIG. 11, power supply switching circuit 90 is illustrated. The circuit comprises, essentially, first, second and third inverters, 100-102, respectively, and first and second switching transistors 103 and 104. Inverter 100 comprises a P-channel transistor 105 having a source connected to $V_{STBY}$ and a drain connected to a drain of an N-channel transistor 106, the source of which is grounded. The gates of transistors 105 and 106 are connected to $V_{DD}$. Inverter 101 comprises a P-channel transistor 107 having a source connected to $V_{DD}$ and a drain connected to a drain of an N-channel transistor 108, the source of which is grounded. The gates of transistors 107 and 108 are connected the drains of transistors 105 and 106 (the output of inverter 100). Inverter 102 comprises a P-channel transistor 109 having a source connected to $V_{STBY}$ and a drain connected to a drain of an N-channel transistor 110, the source of which is grounded. The gates of transistors 109 and 110 are connected the drains of transistors 107 and 108 (the output of inverter 101). P-channel transistor 103 has a gate connected to the drains of transistors 109 and 110 (the output of inverter 102), a source connected through a resistor 111 to $V_{DD}$ and a drain connected to the $V_P$ node of the circuit. P-channel transistor 104 has a gate connected to the drains of transistors 107 and 108, a source connected through a resistor 112 to $V_{STBY}$ and a drain connected to the $V_P$ node of the circuit.

Inverter 100 sets the switchpoint at which the circuit switches $V_P$ from $V_{DD}$ to $V_{STBY}$. In the preferred embodiment, transistor 106 is relatively small compared to transistor 105, so that inverter 100 switches when $V_{DD}$ falls approximately one threshold voltage below $V_{STBY}$. Inverters 101 and 102 should be designed to avoid a condition in which both transistors 103 and 104 are non-conductive at the same time. Such a condition will allow $V_P$ to fall low enough that the drain junctions of transistors 103 and 104 will be forward biased, risking damage to those transistors. In addition, of course, any substantial drop of $V_P$ may cause data loss in the memory array. Resistors 111 and 112 also serve to limit any potentially damaging currents caused by forward biased junctions in transistors 103 and 104.

In order to avoid latch-up problems, transistors 103 and 104 should be protected with extensive guard rings in the circuit layout.

Several possible modifications to the circuit of FIG. 11 should be mentioned. First, it may be desirable to provide a noise damping circuit at the $V_{DD}$ input of inverter 100 to reduce the likelihood that noise on $V_{DD}$ will cause the power supply source to switch to $V_{STBY}$. Second, it is possible to connect a control signal generated from the bits of the test mode control register to the input of inverter 100 along with $V_{DD}$. In particular, if the inverse of the RTSDD bit of the test mode control register is connected to the input of inverter 100, then $V_{STBY}$ will be selected as the power supply for the array whenever soft defect detection is taking place, thus allowing external control over the array power supply voltage. Finally, it is possible to replace inverter 100 with several series connected inverters, all powered by $V_{STBY}$.

Figure 12:
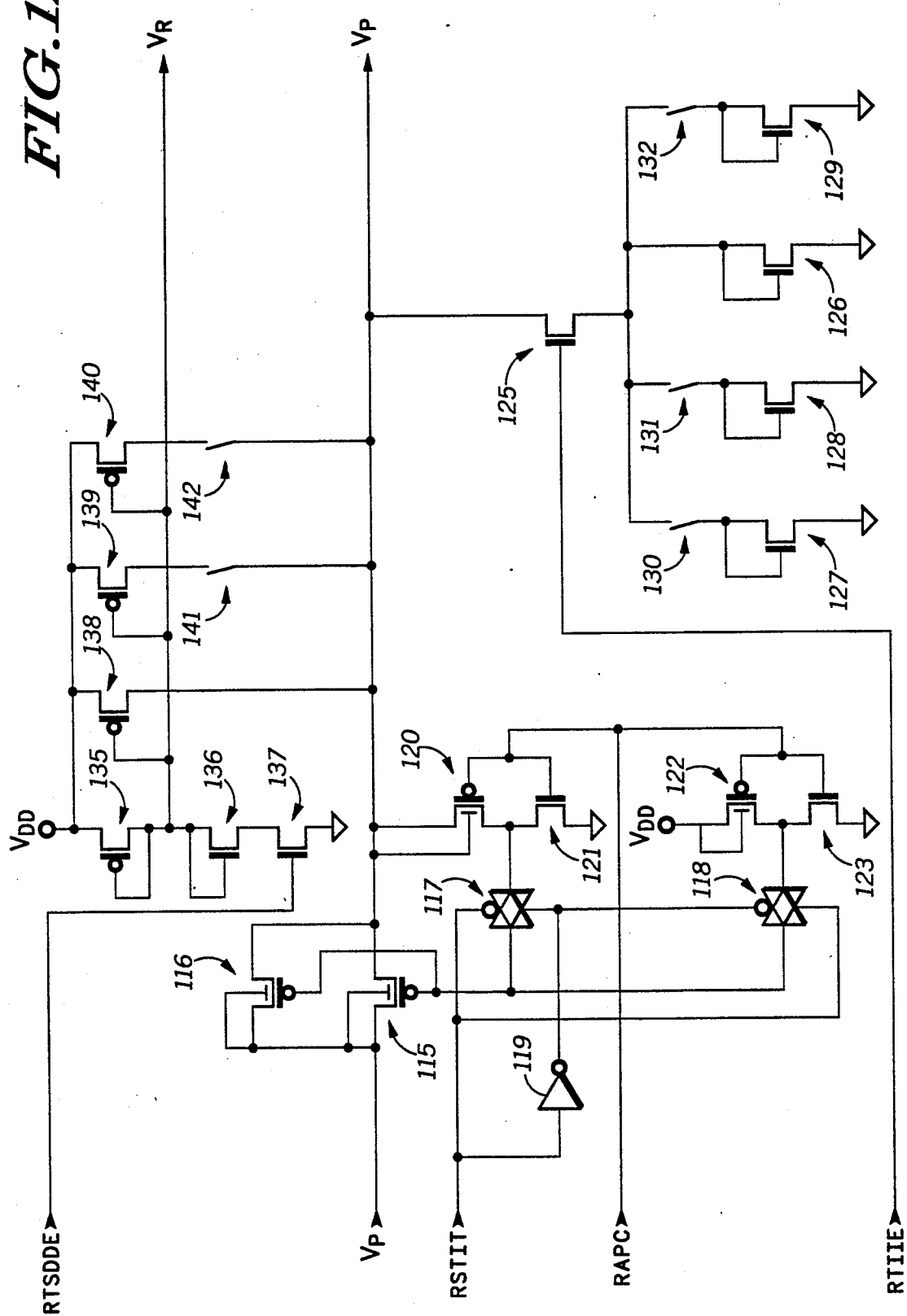
FIG. 12 is a schematic diagram illustrating another portion of the apparatus illustrated in FIG. 10.

Referring now to FIG. 12, power supply conditioning and differential voltage generation circuit 91 is illustrated. Circuit 91 performs three functions: first, it generates the lowered array voltage $V_A$ during soft defect detection; second, it generates a reference voltage, $V_R$, during the current sense test; and third, it performs a preconditioning function prior to the current sense test which is useful to decrease the time required for that test.

Figure 14:
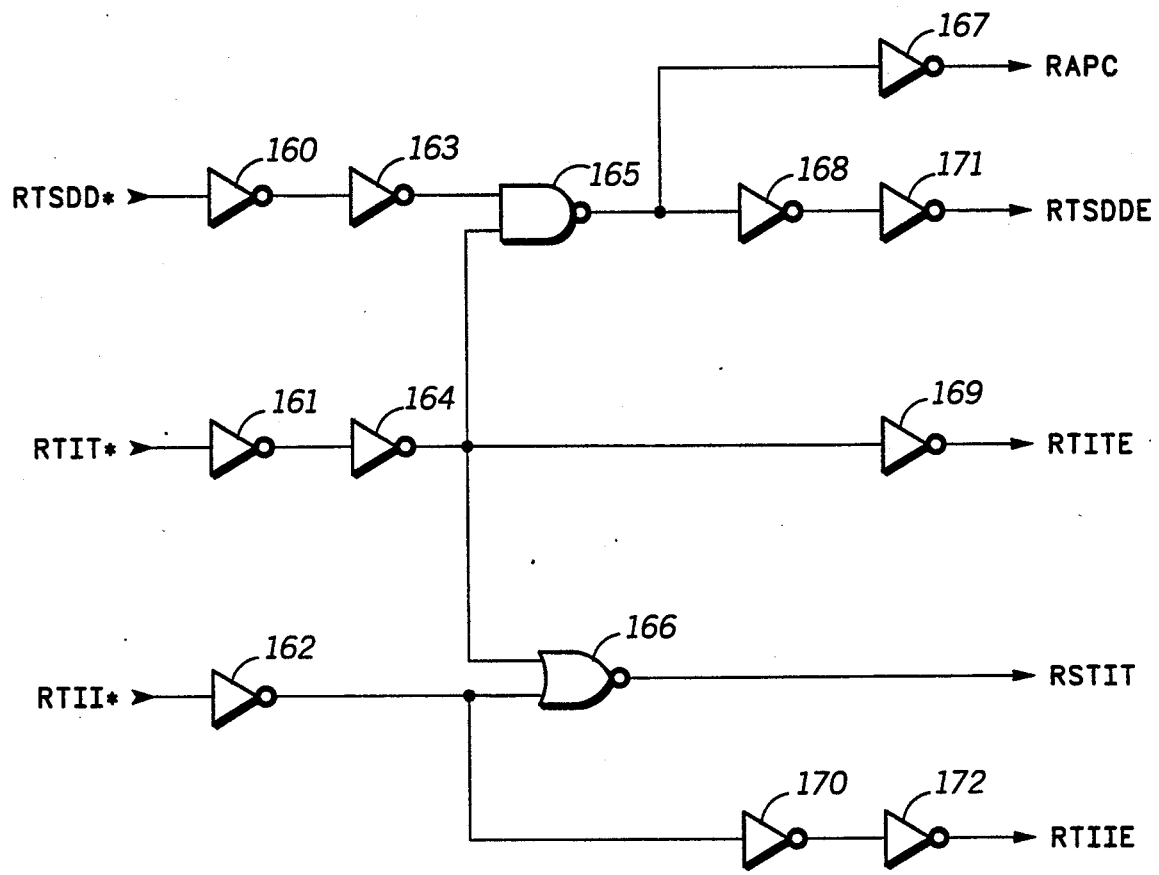
FIG. 14 is a schematic diagram illustrating yet another portion of the apparatus illustrated in FIG. 10.

The inputs to circuit 91 are the control signals RTSDDE, RSTIT, RAPC and RTIIE and the output of circuit 90, $V_P$. FIG. 14 illustrates the logic which produces the control signals from the test mode control register bits.

A pair of P-channel transistors 115 and 116 each have sources connected to $V_P$ and drains connected to $V_A$. The gates of transistors 115 and 116 are each connected to outputs of a pair of transmission gates 117 and 118. A first control input of each of transmission gates 117 and 118 is connected to the control signal RSTIT and a second control input of each of transmission gates 117 and 118 is connected to the output of an inverter 119, whose input is connected to RSTIT. Transmission gate 117 is conductive when RSTIT is low and transmission gate 118 is conductive when RSTIT is high.

The input of transmission gate 117 is connected to the drains of a P-channel transistor 120 and an N-channel transistor 121. The source of P-channel transistor 120 is connected to $V_A$ and the source of N-channel transistor 121 is connected to ground. The gates of transistors 120 and 121 are both connected to the control signal RAPC. The input of transmission gate 118 is connected to the drains of a P-channel transistor 122 and an N-channel transistor 123. The source of transistor 122 is connected to $V_{DD}$ and the source of transistor 123 is connected to ground. The gates of transistors 122 and 123 are also both connected to RAPC.

The gate of an N-channel transistor 125 is connected to the control signal RTIIE. The drain of transistor 125 is connected to $V_A$. The source of transistor 125 is connected to a drain of an N-channel transistor 126. The source of transistor 126 is connected to ground. The gate of transistor 126 is connected to the drain thereof. Three N-channel transistors 127, 128 and 129 each have a source connected to ground and a drain connected to a gate thereof. The drains of transistors 127, 128 and 129 are individually connectable to the source of transistor 125 by means of mask options 130, 131 and 132, respectively.

The source of a P-channel transistor 135 is connected to $V_{DD}$. The gate and drain of transistor 135 are connected to $V_R$. The gate and drain of an N-channel transistor 136 are also connected to $V_R$. The source of transistor 136 is connected to the drain of an N-channel transistor 137. The gate of transistor 137 is connected to the control signal RTSDDE and the source of transistor 137 is connected to ground. The gate of a P-channel transistor 138 is connected to $V_R$. The source of transistor 138 is connected to $V_{DD}$ and the drain of transistor 138 is connected to $V_A$. Two P-channel transistors 139 and 140 also have their sources connected to $V_{DD}$ and their gates connected to $V_R$. The drains of transistor 139 and 140 are individually connectable to $V_A$ by means of mask options 141 and 142, respectively.

Transistors 115 and 116, and the circuits connected to the gates thereof, serve to determine the relationship of $V_A$ to $V_P$. There are three possible relationships defined by these circuits: $V_A$ is approximately equal to $V_P$, $V_A$ is a predetermined amount below $V_P$, and $V_A$ is isolated from $V_P$. The first of the three relationships is obtained when the RAPC control signal is high. In this case, regardless of the state of RSTIT, the gates of transistors 115 and 116 will be coupled to ground and the transistors will be conductive. The second of the two relationships is obtained when RAPC is low and RSTIT is also low. In this case, the gates of transistors 115 and 116 are coupled to the drains thereof, through transmission gate 117 and transistor 120, creating a threshold voltage drop across the transistors. The third relationship is obtained when RAPC is low and RSTIT is high. In this case, the gates of transistors 115 and 116 are coupled to $V_{DD}$, through transmission gate 118 and transistor 122, making transistors 115 and 116 non-conductive.

The use of two transistors (115 and 116) to produce the voltage drop from $V_P$ to $V_A$ is intended to add flexibility to the circuit. If a greater voltage drop is determined to be desirable than is produced by the combination of the two transistors, one may be eliminated from the circuit by, for instance, using a laser to cut the metal lines connecting transistor 116 to the remainder of the circuit.

As will be further described below, $V_A$ is approximately equal to $V_P$ during normal operation, $V_A$ is a predetermined amount below $V_P$ when required to minimize the voltage clamping problem during soft defect detection and is isolated from $V_P$ during the current sense test.

The circuit comprising transistors 135, 136, 137, 138, 139 and 140 performs the functions of establishing the reference voltage $V_R$ and of setting the threshold against which the array leakage current is measured during the current sense test. The circuit, which is active whenever the RTSDDE signal is high, generates $V_R$ by means of the action of transistors 135 and 136. Transistor 136 draws a constant current through transistor 135, establishing a voltage drop from $V_{DD}$ to $V_R$. In addition, transistors 135 and 138 form a current mirror circuit. That is, the current drawn through transistor 135 is "mirrored" by a current flowing through transistor 138. If transistors 135 and 138 are the same size, the current flowing through transistor 138 will be equal to that flowing through transistor 135 and, thereby, to the current established by transistor 136. Transistors 139 and 140, which may be added to the circuit by means of mask options 141 and 142, respectively, may be used to alter the magnitude of the mirroring current supplied to $V_A$.

Assuming that $V_A$ is isolated from $V_P$, as it is during the current sense test, the sole supply of current to $V_A$ to replace that drawn by the memory array is the mirror current, or reference current, supplied by transistor 138 (and, optionally, by transistors 139 and 140). If the array leakage current is smaller than the reference current, then the voltage of $V_A$ will be higher than that of $V_R$. Otherwise, $V_A$ will be lower than $V_R$. Thus, the mirror current sets the threshold, or reference, for the current sense test.

Transistor 125 is used to control the application of a constant current drain to $V_A$ during a preconditioning operation which is performed prior to the current sense test. As is apparent, the magnitudes of the currents involved in the current sense test are extremely small: on the order of ten microamperes. Also, the capacitance of the entire memory array is, relatively speaking, enormous: on the order of tens or hundreds of thousands of picofarads. This combination would cause the time required to sense an abnormally high array leakage current to be undesirably long. The preconditioning operation prevents this situation by bringing $V_A$ down to a level very close to $V_R$ immediately prior to the current sense test. The rapidity with which the voltage of $V_A$ is lowered during preconditioning can be altered by selecting how many of transistors 127, 128 and 129 are connected in parallel with transistor 126.

Figure 13:
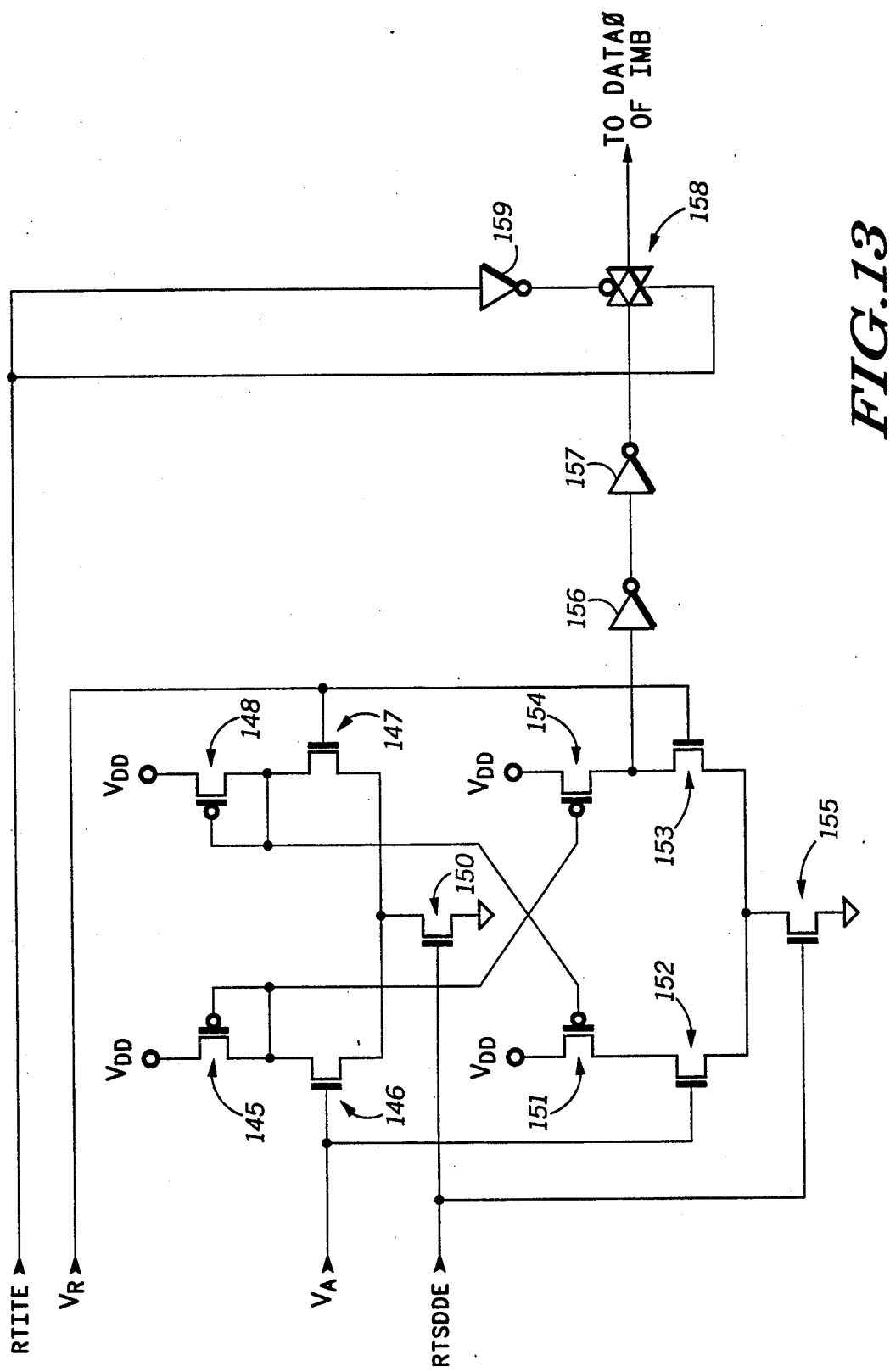
FIG. 13 is a schematic diagram illustrating still another portion of the apparatus illustrated in FIG. 10.

Referring now to FIG. 13, differential sense amplifier 94 is illustrated. The inputs to sense amplifier 94 are $V_A$ and $V_R$ and the control signals RTSDDE and RTITE. The source of a P-channel transistor 145 is connected to $V_{DD}$, the gate of transistor 145 is connected to a drain of transistor 145 and the drain of transistor 145 is connected to a drain of an N-channel transistor 146. The gate of transistor 146 is connected to $V_A$ and the source of transistor 146 is connected to the source of an N-channel transistor 147. The gate of transistor 147 is connected to $V_R$. The drain of transistor 147 is connected to the drain of a P-channel transistor 148. The gate of transistor 148 is connected to the drain thereof. The source of transistor 148 is connected to $V_{DD}$.

The drain of an N-channel transistor 150 is connected to the sources of transistor 146 and 147. The source of transistor 150 is connected to ground. The gate of transistor 150 is connected to the control signal RTSDDE.

The gate and drain of transistor 148 are connected to the gate of a P-channel transistor 151. The source of transistor 151 is connected to $V_{DD}$. The drain of transistor 151 is connected to the drain of an N-channel transistor 152. The gate of transistor 152 is connected to $V_A$. The source of transistor 152 is connected to the source of an N-channel transistor 153. The gate of transistor 153 is connected to the control signal $V_R$. The drain of transistor 153 is connected to the drain of a P-channel transistor 154. The gate of transistor 154 is connected to the gate and drain of transistor 145. The source of transistor 154 is connected to $V_{DD}$. The sources of transistors 152 and 153 are connected to the drain of an N-channel transistor 155. The gate of transistor 155 is connected to RTSDDE.

The drains of transistors 153 and 154 are connected to the input of an inverter 156. The output of inverter 156 is connected to the input of an inverter 157. The output of inverter 157 is connected to a transmission gate 158. The control input of transmission gate 158 is connected to the control signal RTITE and the inverse control input of transmission gate 158 is connected to the output of inverter 159, whose input is connected to the control signal RTITE. Transmission gate 158 is conductive when RTITE is high. The output of transmission gate 158 is coupled, through an inverting driver not shown, to the least significant data bit line (DATA0) of IMB 82. One possible modification to the circuit of FIG. 13 would be to add a dummy load connected to the drains of transistors 151 and 152 in order to balance the circuit.

Referring now to FIG. 14, the control logic which generates the various control signals used in the circuits of FIGS. 10-13 is illustrated. A control signal RTSDD*, which is the inverse of the RTSDD bit of the test mode control register, is connected to the input of an inverter 160. A control signal RTIT*, which is the inverse of the RTIT bit of the test mode control register, is connected to the input of an inverter 161. A control signal RTII*, which is the inverse of the RTII bit of the test mode control register, is connected to the input of an inverter 162. The output of inverter 160 is connected to the input of an inverter 163 and the output of inverter 161 is connected to the input of an inverter 164. The outputs of inverters 163 and 164 are connected as inputs to an AND gate 165. The outputs of inverters 164 and 162 are connected as inputs to a NOR gate 166. The output of AND gate 165 is connected to the inputs of inverters 167 and 168. The output of inverter 164 is connected to the input of an inverter 169. The output of inverter 162 is connected to the input of an inverter 170. The output of inverter 168 is connected to the input of an inverter 171. The output of inverter 170 is connected to the input of an inverter 172.

The output of inverter 167 is the control signal RAPC. The output of inverter 171 is the control signal RTSDDE. The output of inverter 169 is the control signal RTITE. The output of NOR gate 166 is the control signal RSTIT. The output of inverter 172 is the control signal RTIIE.

Table II sets forth the useful permutations of the values of the IMB TEST MODE control signal and the control bits of the test mode control register as they are used to define eight different test modes. The use of these test modes in the actual testing of the memory device is described further below.

TABLE II

| TEST MODE | IMB TEST MODE | RTIT | RTII | RTSTD | RTRH | RTSDD | RTC1 | RTC0 |
|---|---|---|---|---|---|---|---|---|
| #1 | 0 | 0 | 0 | 0 | 0 | 0 | 0 | 0 |
| #2 | 1 | 0 | 0 | 0 | 0 | 0 | 0 | 0 |
| #3 | 1 | 1 | 1 | 0 | 0 | 1 | 0 | 0 |
| #4 | 1 | 1 | 0 | 0 | 0 | 1 | 0 | 0 |
| #5 | 1 | 0 | 1 | 0 | 0 | 1 | 0 | 0 |
| #6 | 1 | 0 | 1 | 1 | 0 | 1 | * | * |
| #7 | 1 | 0 | 1 | 0 | 1 | 1 | * | * |
| #8 | 1 | 0 | 1 | 1 | 1 | 1 | * | * |

Test mode #1 is, in fact, not a test mode at all, but is the normal mode of operation of memory module 84. Reads and writes to the memory proceed as usual. Test mode #2 is a conventional test mode. Again, reads and writes proceed as usual. Conventional memory tests, such as writing various data patterns to the memory and reading the memory to confirm proper operation, might be carried out in test mode #2. Test mode #3 is the preconditioning operation which prepares for the current sense test. Test mode #4 is the current sense test itself. Test modes #5, #6, #7 and #8 are the four soft defect detection procedures which must be used for each cell in the array to locate soft defects. The difference between these four modes is the state of the RTRH and RTSTD control bits, which determine which of the two inverters in each cell is being tested and whether first or second soft defect detection procedure (write 1 or write 0) is being carried out.

The states of the RTC1 and RTC0 bits for the various test modes will depend upon characterization data gathered with test chips or the like. The amount of extra sensing time required for the various tests is strongly dependent upon process characteristics and the like which cannot be reliably predicted. Therefore, empirical data gathered from pre-production integrated circuits is used to select appropriate values for these control bits during production testing.

In actual operation, the apparatus described above can be used to rapidly and exhaustively test an SRAM array for soft defects. First, microcomputer 10 is placed into its test mode, thus rendering the IMB TEST MODE signal active and placing memory module 84 into test mode #2. Normal read/write testing of the memory array may be carried out in this mode in order to detect hard defects. In addition, the array is prepared for the current sense test by storing particular values therein. In order to exhaustively test the array, it is necessary to perform the current sense test twice: once when each cell in the array is storing a 1 and once when each cell in the array is storing a 0. So, prior to starting the soft defect detection procedure, the array is prepared by storing 1's in each cell.

The soft defect detection procedure is now begun by setting the RTSDD control bit in the test mode control register to 1. At the same time, the current test preconditioning process is begun by setting the RTIT and RTII bits to 1. Memory module 84 is now in test mode #3. Referring to FIG. 12, this will cause the gates of transistors 115 and 116 to be connected to $V_A$ and will also cause transistor 125 to be conductive. The current drawn through transistor 125 will draw down the voltage of $V_A$. At some point, the voltage of $V_A$ will drop below that of $V_R$. This will cause differential sense amplifier 94 to switch states and the DATA0 line of IMB 82 will become equal to 1. An external test system must constantly monitor the state of DATA0 while the preconditioning procedure is being performed. When DATA0 becomes equal to 1, the preconditioning process is complete and the current sense test itself is performed.

When the tester detects that DATA0 has been set to 1 by differential sense amplifier 94, it clears the RTII bit of the test mode control register to 0 thus placing memory module 84 into test mode #4 and beginning the current sense test. Referring back to FIG. 12, this has the effect of changing the RSTIT control signal to 1, while RAPC remains 0. This connects the gates of transistors 115 and 116 to $V_{DD}$, rendering them non-conductive and isolating $V_A$ from $V_P$. It also causes the RTIIE control signal to become 0, which renders transistor 125 non-conductive. In this condition, the current sense reference current is being supplied to $V_A$ through transistor 138 (and transistors 139 and 140, if the appropriate mask options have been selected) and the memory array itself is drawing a certain amount of current from $V_A$. If the array leakage current is less than the threshold current supplied to $V_A$, then the voltage of $V_A$ will rise and become greater than $V_R$. If the leakage current is greater than the reference current, then $V_A$ will remain less than $V_R$. After a preselected delay, the tester again reads the state of DATA∅ of IMB 82. If it remains equal to 1, then the array leakage current is too great and the array contains one or more cells with soft defect. If, however, DATA∅ reads as 0 then the array has passed this test.

The test procedure continues by briefly returning memory module 84 to test mode #2 so that the array can be programmed with all 0's. Then the current sense preconditioning and current sense test process just described is repeated.

After the second current sense test, the tester places memory module 84 into test mode #5 by clearing RTIT to 0 and setting the delay bits RTC0 and RTC1 to predetermined values. The tester then operates IMB 82 to access each location in the memory module. As is apparent, each location involves more than memory cell. In the preferred embodiment, each access of the memory module selects 16 cells, corresponding to the number of data lines of IMB 82. As each location is accessed, and after the sense amplifier delay time has passed, the tester reads the data lines of IMB 82. Since, in the test mode #5 the input data (RTSTD) is 0, a passing part will produce values of 0 on each of the IMB data lines. Any 1's on the IMB data lines indicate the presence of soft defects.

Test modes #6, #7 and #8 are used sequentially by the tester and in each case the IMB data lines should match the state of RTSTD for that mode. Assuming that all test are passed, the memory array can be said to be free of soft defects.

The preferred embodiment disclosed above efficiently combines the features necessary for implementing the soft defect detection techniques of the present invention with standby power supply features common to microcomputers having SRAM modules. In addition, an on-board current sense test circuit is included which can perform the current sense test in a relatively short period of time.

One possible modification to the disclosed embodiments of the present invention involves the current sense amplifier used for leakage current sensing. One skilled in the art will appreciate that this element may be located on the same integrated circuit as the memory device or may be located off-chip. For instance, assuming that access to the particular power supply line via a probe or the like is possible, the current sense

We claim:

1. A memory device comprising:
   a memory cell;
   a word line;
   a pair of complementary bit lines selectably coupled to said memory cell under control of said word line;
   input logic means for simultaneously controlling a state of both said complementary bit lines during a normal write mode and for controlling a state of one of said complementary bit lines while leaving a state of the other of said complementary bit lines uncontrolled during a soft defect detection mode; and
   sensing means for simultaneously controlling a state of both said complementary bit lines during a normal write mode and for sensing the state of said other of said complementary bit lines during the soft defect detection mode.

2. A memory device according to claim 1 further comprising:
   means for sensing a leakage current flowing through said memory cell.

3. A memory device according to claim 1 further comprising:
   means for precharging said bit lines, said means for precharging being capable of precharging said bit lines to both high state and low states.

4. A memory device according to claim 1 further comprising:
   a Y-select line;
   a pair of complementary data lines selectably coupled to said pair of complementary bit lines under control of said Y-select line; and
   wherein said input logic means further comprises:
   means for simultaneously controlling a state of both said complementary data lines during the normal write mode and for controlling the state of only one of said complementary data lines during the soft defect detection mode.

5. A memory device according to claim 4 wherein said sensing means further comprises:
   a differential sense amplifier coupled to both said complementary data lines;
   a first non-differential sense amplifier coupled to one of said complementary data lines; and
   a second non-differential sense amplifier coupled to the other of said complementary data lines.

6. A memory device comprising:
   an array comprising a plurality of memory cells;
   a plurality of word lines intersecting said array;
   a plurality of complementary bit line pairs intersecting said array, each of said memory cells being couple-able to one of said complementary bit line pairs under control of one of said word lines;
   a complementary data line pair;
   a plurality of Y-select lines, said complementary data line pair being couple-able to at least one of said complementary bit line pairs under control of one of said plurality of Y-select lines;
   control means;
   input means couple-able to said complementary data line pair for simultaneously controlling a state of both said complementary data lines during a normal write mode and for controlling the state of only one of said complementary data lines during a soft defect detection mode, said input means being under control of said control means to determine the mode of said input means; and
   sense amplifier means for simultaneously sensing the states of said complementary data lines during a normal read mode and for sensing the state of only one of said complementary data lines during a soft defect detection mode, said sense amplifier means being under control of said control means to determine the mode of said sense amplifier means.

7. A memory device according to claim 6 further comprising:

current sense means coupled to each of said plurality of memory cells for sensing a leakage current therethrough.

8. A memory device according to claim 6 wherein:
said current sense means is under control of said control means to sense said leakage current during a current sense mode.

9. A memory device according to claim 6 further comprising:
first precharge means for precharging each of said complementary bit lines to one of a high and a low state, said first precharge means being under control of said control means; and
second precharge means for precharging each of said complementary data lines to one of a high and a low state, said second precharge means being under control of said control means.

10. A memory device according to claim 9 wherein:
said control means is responsive to a state of said input means, during a soft defect detection mode, to direct said first and second precharge means to precharge said bit lines and data lines to a state identical to said state of said input means.

11. An integrated circuit microcomputer comprising:
a central processing unit;
a memory unit; and
communication means coupled to the central processing unit and to the memory unit for providing communication therebetween;
wherein the memory unit further comprises:
an array comprising a plurality of memory cells;
a plurality of word lines intersecting said array;
a plurality of complementary bit line pairs intersecting said array, each of said memory cells being couple-able to one of said complementary bit line pairs under control of one of said word lines;
a complementary data line pair;
a plurality of Y-select lines, said complementary data line pair being couple-able to at least one of said complementary bit line pairs under control of one of said plurality of Y-select lines;
control means;
input means couple-able to said complementary data line pair for simultaneously controlling a state of both said complementary data lines during a normal write mode and for controlling the state of only one of said complementary data lines during a soft defect detection mode, said input means being under control of said control means to determine the mode of said input means; and
sense amplifier means for simultaneously sensing the states of said complementary data lines during a normal read mode and for sensing the state of only one of said complementary data lines during a soft defect detection mode, said sense amplifier means being under control of said control means to determine the mode of said sense amplifier means.

12. An integrated circuit microcomputer according to claim 11 further comprising:
current sense means coupled to each of said plurality of memory cells for sensing a leakage current therethrough.

13. An integrated circuit microcomputer according to claim 12 wherein:
said current sense means is under control of said control means to sense said leakage current during a current sense mode.

14. An integrated circuit microcomputer according to claim 11 further comprising:
first precharge means for precharging each of said complementary bit lines to one of a high and a low state, said first precharge means being under control of said control means; and
second precharge means for precharging each of said complementary data lines to one of a high and a low state, said second precharge means being under control of said control means.

15. An integrated circuit microcomputer according to claim 14 wherein:
said control means is responsive to a state of said input means, during a soft defect detection mode, to direct said first and second precharge means to precharge said bit lines and data lines to a state identical to said state of said input means.

* * * * *